(12) United States Patent
Kimbel et al.

(10) Patent No.: US 10,060,046 B2
(45) Date of Patent: Aug. 28, 2018

(54) CRYSTAL PULLER FOR INHIBITING MELT CONTAMINATION

(71) Applicant: Corner Star Limited, Kowloon (HK)

(72) Inventors: Steven Lawrence Kimbel, St. Charles, MO (US); Benjamin Michael Meyer, Defiance, MO (US); Salvador Zepeda, St. Peters, MO (US); Steven John Ferguson, Scappoose, OR (US)

(73) Assignee: Corner Star Limited, Kowloon (HK)

( * ) Notice: Subject to any disclaimer, the term of this patent is extended or adjusted under 35 U.S.C. 154(b) by 0 days.

(21) Appl. No.: 14/857,880

(22) Filed: Sep. 18, 2015

(65) Prior Publication Data
US 2016/0083864 A1    Mar. 24, 2016

Related U.S. Application Data

(60) Provisional application No. 62/052,914, filed on Sep. 19, 2014.

(51) Int. Cl.
*C30B 15/10* (2006.01)
*C30B 15/00* (2006.01)
*C30B 15/02* (2006.01)

(52) U.S. Cl.
CPC ............ *C30B 15/10* (2013.01); *C30B 15/002* (2013.01); *C30B 15/02* (2013.01); *Y10T 117/10* (2015.01);
(Continued)

(58) Field of Classification Search
CPC ............. Y10T 117/10; Y10T 117/1032; Y10T 117/106; Y10T 117/1068; C30B 15/002; C30B 15/02; C30B 15/10
See application file for complete search history.

(56) References Cited

U.S. PATENT DOCUMENTS

| 4,330,362 A | 5/1982 | Zulehner |
| 4,956,153 A * | 9/1990 | Yamagishi |

(Continued)

FOREIGN PATENT DOCUMENTS

| DE | 1912331 A1 * | 11/1969 | ............. B65D 90/34 |
| DE | 19712331 A1 | 10/1998 | |
| EP | 0229322 B1 | 8/1992 | |

OTHER PUBLICATIONS

International Search Report and Written Opinion of the International Searching Authority regarding PCT/US2015/050859 dated Oct. 26, 2015; 12 pgs.

*Primary Examiner* — Hua Qi
(74) *Attorney, Agent, or Firm* — Armstron Teasdale LLP

(57) ABSTRACT

A crystal puller for growing a crystal ingot includes a housing, insulation, a crucible assembly, a heat shield, and a dust barrier. The housing encloses a growth chamber, and has an upper wall with an inner surface and an aperture. The insulation separates an inside of the housing into an upper area and a lower area, and has a central opening. The crucible assembly is within the lower area to contain the melt. The heat shield is adjacent the central opening of the insulation, and forms a labyrinth gas path with the crucible assembly. The dust barrier extends from the inner surface of the upper wall to one of the insulation and the heat shield, and forms a seal with the upper wall around the aperture to inhibit particles from entering the growth chamber through the upper area of the housing.

18 Claims, 7 Drawing Sheets

(52) U.S. Cl.
CPC ...... *Y10T 117/106* (2015.01); *Y10T 117/1032* (2015.01); *Y10T 117/1068* (2015.01)

(56) References Cited

U.S. PATENT DOCUMENTS

| | | | |
|---|---|---|---|
| 5,248,378 A * | 9/1993 | Oda | C30B 15/14 |
| | | | 117/217 |
| 5,264,189 A * | 11/1993 | Yamashita | C30B 15/14 |
| | | | 117/204 |
| 5,361,721 A * | 11/1994 | Takano | C30B 15/00 |
| | | | 117/208 |
| 5,578,123 A | 11/1996 | Vilzmann et al. | |
| 5,720,810 A * | 2/1998 | Arai | |
| 5,942,032 A | 8/1999 | Kim et al. | |
| 5,951,753 A | 9/1999 | Dornberger et al. | |
| 5,954,874 A * | 9/1999 | Hunter | |
| 6,071,340 A * | 6/2000 | Li | C30B 15/20 |
| | | | 117/14 |
| 8,262,797 B1 | 9/2012 | Bender et al. | |
| 2010/0148448 A1* | 6/2010 | Pinto | B22F 5/106 |
| | | | 277/371 |
| 2010/0175612 A1* | 7/2010 | Narushima | |
| 2013/0233237 A1* | 9/2013 | Bender | |
| 2014/0261155 A1 | 9/2014 | Kimbel et al. | |

* cited by examiner

CRYSTAL PULLER FOR INHIBITING MELT CONTAMINATION

CROSS-REFERENCE TO RELATED APPLICATIONS

This application claims priority to U.S. Provisional Application No. 62/052,914, filed Sep. 19, 2014, which is hereby incorporated by reference in its entirety.

FIELD

This disclosure generally relates to crystal pullers for growing monocrystalline ingots of semiconductor or solar-grade material, and more particularly to dust barriers for use in crystal pullers to prevent particles from entering a melt adjacent to a growing crystal ingot.

BACKGROUND

In the production of single silicon crystals grown by the Czochralski (CZ) method, polycrystalline silicon is first melted within a crucible, such as a quartz crucible, of a crystal pulling device to form a silicon melt. The puller then lowers a seed crystal into the melt and slowly raises the seed crystal out of the melt, solidifying the melt onto the seed crystal. To produce a single high quality crystal using this method, the stability of the surface of the melt immediately adjacent to the ingot must be maintained substantially constant. Moreover, the melt immediately adjacent to the ingot should be maintained substantially free of solid particles and other contaminants to prevent loss of zero dislocation growth. Prior systems for accomplishing these goals have not been completely satisfactory. Thus, there exists a need for a more efficient and effective system to prevent solid particles from reaching the melt adjacent to the ingot and to limit surface disruptions in the melt adjacent to the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a crystal puller for growing a crystal ingot from a melt is provided. The crystal puller includes a housing, insulation, a crucible, a heat shield, and a dust barrier. The housing encloses a growth chamber, and has an upper wall with an inner surface and an aperture. The insulation separates an inside of the housing into an upper area and a lower area, and has a central opening. The crucible assembly is within the lower area to contain the melt. The heat shield is adjacent the central opening of the insulation, and forms a labyrinth gas path with the crucible assembly. The dust barrier extends from the inner surface of the upper wall to one of the insulation and the heat shield, and forms a seal with the upper wall around the aperture to inhibit particles from entering the growth chamber through the upper area of the housing.

In another aspect, a device for inhibiting particles from entering a melt located in a growth chamber of a crystal puller is provided. The crystal puller has an upper wall and insulation that define an upper area of the growth chamber. The upper wall has an inner surface and an aperture for removal of the crystal ingot from the growth chamber. The device includes a dust shield for insertion into the crystal puller between the upper wall and the insulation, and a seal. The dust shield has a top portion with a diameter greater than a diameter of the aperture to allow unobstructed access to the growth chamber through the upper wall. The seal is connected with the dust shield along the top portion thereof, and is configured for compression against the upper wall upon installation of the dust shield in the crystal puller to inhibit passage of particles between the dust shield and the upper wall.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
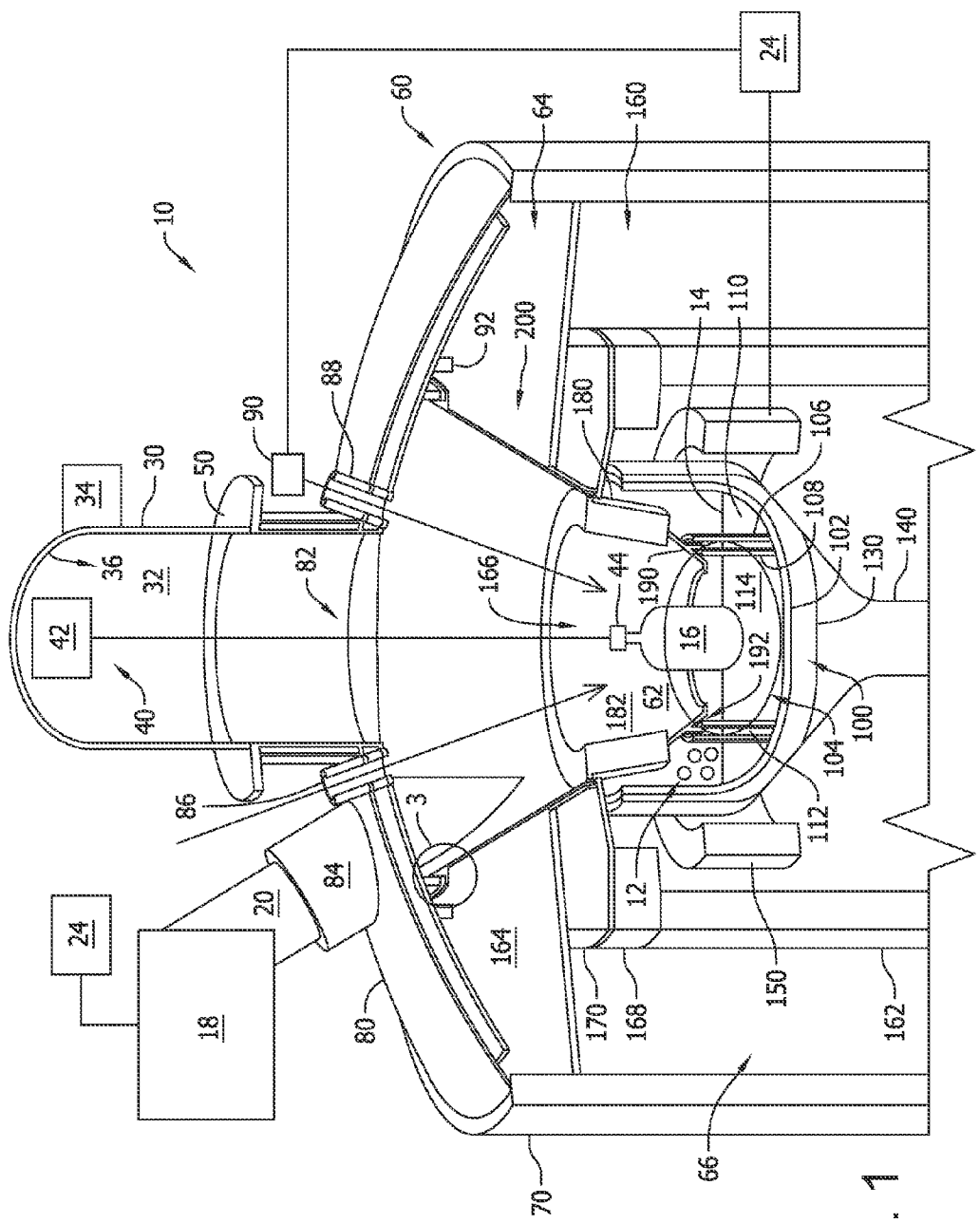
FIG. 1 is a schematic sectional view of a crystal puller including a dust barrier installed in a lower housing of the crystal puller.

Referring to FIG. 1, a crystal puller is shown schematically and is indicated generally at 10. The crystal puller 10 is used to produce a single crystal ingot by a Czochralski method. As discussed herein, the system is described in relation to the continuous Czochralski method of producing single crystal ingots, though a batch process may be used. However, systems consistent with this disclosure may also be used to produce multi-crystalline ingots, such as by a directional solidification process.

During the continuous Czochralski method of producing single crystal ingots, solid feedstock material 12 is supplied to and melted, or liquefied, in the crystal puller 10 to form a molten feedstock or melt 14, while a monocrystalline or crystal ingot 16 is simultaneously grown from the melt. The solid feedstock material 12 is supplied to the crystal puller 10 from a feeder 18 through a feed tube 20, which is discussed in more detail below. This method allows multiple ingots 16 to be produced by continuously adding solid feedstock material 12 to the crystal puller 10 as the melt 14 is depleted during the forming process of the ingots.

The crystal puller 10 includes a water-cooled housing including an upper housing 30 connected through a flanged connection 50 with a lower housing 60. The upper housing 30 encloses a crystal pull or removal chamber 32, and the lower housing 60 encloses a crystal growth chamber 62. A pump (not shown) or other suitable means may be provided for drawing a vacuum into the interior of the housing.

The upper housing 30 includes a gas system 34 for supplying an inert gas 36, such as argon, through the pull chamber and to the crystal growth chamber 62. The inert gas 36 acts to both cool the growing ingot 16 and to inhibit particles from contacting the growing ingot or contaminating the melt 14, which is discussed in detail below.

The upper housing 30 also includes a pull system 40 with a pull mechanism 42 and a seed crystal 44. The seed crystal 44 is attached to a portion of pull mechanism 42 disposed over melt 14. The pull mechanism 42 provides movement of the seed crystal 44 in a direction perpendicular to the surface of melt 14. The pull mechanism 42 extends down through the pull chamber 32 and is capable of raising, lowering and rotating the seed crystal 44. The seed crystal 44 is used to grow the ingot 16.

In growing the ingot 16, the pull mechanism 42 lowers the seed crystal 44 until it contacts the surface of the melt 14. Once the seed crystal 44 begins to melt, the pull mechanism 42 slowly raises the seed crystal 44 up through the growth chamber 62 and pull chamber 32 to grow the ingot 16. The speed at which the pull mechanism 42 rotates the seed crystal 44 and the speed at which the pulling mechanism raises the seed crystal 44 are controlled by an external control system or controller 24.

The lower housing 60 enclosing the crystal growth chamber 62 has a generally cylindrical shaped, outer side wall or cylindrical wall 70 and a generally dome shaped upper wall or dome 80. Both the cylindrical wall 70 and upper wall 80 may have various ports or connections for connecting material, such as liquid or gas, and electrical signals, such as temperature and other sensors, with the crystal growth chamber 62. These connections may be connected with the external controller 24 for monitoring and controlling the process within the lower housing 60.

In particular, the upper wall 80 includes an aperture 82, a feed port 84, a view port 86, and a temperature port 88. The crystal ingot 16 is removed from the growth chamber 62 through the aperture 82 by being raised with the pull system 40 into the pull chamber 32. The feed port 84 is connected with the feed tube 20 for supplying solid feedstock material 12 to the growth chamber 62. The view port 86 provides an operator with a direct line of sight to the growing ingot 16, which allows the operator to observe the crystal growing process within the growth chamber 62. The view port 86 may include a transparent material to allow the operator to directly observe the crystal growing process or a camera for remotely observing it.

The temperature port 88 also has direct line of sight of the growing ingot 16 to enable the temperature of the melt 14 and/or the growing ingot 16 to be measured with a sensor 90. The sensor 90, such as a pyrometer or like temperature sensor, provides a continuous measurement of the temperature of melt 14 at the crystal/melt interface of the growing single ingot 16. Sensor 90 also may be configured to measure the temperature of the growing ingot 16. Sensor 90 is communicatively coupled with controller 24. Additional temperature sensors may be used to measure and provide temperature feedback to the controller with respect to points that are critical to the melting of the feedstock material or in controlling the growing ingot. While a single communication lead is shown for clarity, one or more temperature sensor(s) may be linked to the controller by multiple leads or a wireless connection, such as by an infra-red data link or another suitable means.

The lower housing 60 contains a crucible assembly 100 seated in a graphite susceptor 130. The crucible assembly 100 contains the melt 14 from which the ingot 16 is grown. The susceptor 130 is mounted on a turntable 140 for rotation of the susceptor 130 and crucible assembly 100 about a central longitudinal axis of the crystal puller 10. The crucible assembly 100 may also be capable of being raised within the growth chamber 62 to maintain the surface of the molten source material or melt 14 at a generally constant level as the ingot 16 is grown and source material is removed from the melt.

The crucible assembly 100 is surrounded by an electrical resistance heater 150 and insulation 160. The heater 150 heats solid feedstock material 12 placed in the crucible assembly 100 to liquefy it and maintain the resulting melt 14 in a molten state. Heater 150 is generally cylindrical in shape and provides heat to the sides of the crucible assembly 100. The heater 150 is connected with and controlled by the external controller 24 so that the temperature of the melt 14 is precisely controlled throughout the pulling process.

In some embodiments, more than one heater may be disposed around the crucible to provide heat. In these embodiments, the amount of current supplied to each of the heaters by controller 24 may be separately and independently chosen to optimize the thermal characteristics of the melt 14.

The controller 24 may also be connected with the feeder 18 to vary the supply of feedstock material 12 for achieving optimal growth conditions within the crystal growth chamber 62. In these embodiments, the controller 24 controls electric current provided to the feeder 18, to control power delivery, and the amount of feedstock material 12 supplied to the crucible assembly 100 to thereby control the temperature of the melt 14.

Solid feedstock material 12 may be placed into the crucible assembly from feeder 18 through feed tube 20. The feedstock material 12 is at a much lower temperature than the surrounding melt 14 and absorbs heat from the melt as the feedstock material's temperature rises, and as the solid feedstock material liquefies in the outer zone to form an outer melt portion. As the solid feedstock material 12 (sometimes referred to as "cold feedstock") absorbs energy from melt 14, the temperature of the surrounding melt falls proportionately to the energy absorbed.

The amount of feedstock material 12 added to the melt is controlled by feeder 18, which is responsive to activation signals from the controller 24. The amount of cooling of the melt 14 is precisely determined and controlled by controller 24. Controller 24 will either add or not add feedstock material 12 to adjust the temperature and the mass of the melt 14. The addition of feedstock material 12 may be based on the mass of the silicon in the crucible, e.g., by measuring the weight or measuring liquid height of the melt.

The controller 24 controls electric current provided to the heater 150, to control heater power delivery, and the supply of feedstock material 12 to thereby control the temperature of the melt 14. By controlling the heat and the supply of feedstock material 12 the controller is able to provide suitable growth conditions for the ingot 16.

The insulation 160 controls the heat transfer around the crucible assembly 100 and the cooling rate of the growing ingot 16. The insulation 160 includes a side insulation 162 that surrounds the heater 150 and a top insulation 164 that separates the inside of the lower housing 60 into an upper area 64 and a lower area 66. The upper area 64 is a low pressure or dead (no recirculation) region. The crucible assembly 100 and heater 150 are housed in the lower area 66. The insulation 160 acts to contain the heat produced by the heater 150 and to minimize the space around the crucible assembly 100 that requires heating by the heater.

As shown in FIG. 1, the top insulation 164 has a central opening 166 aligned with both the aperture 82 in the upper wall 80 and the center of the crucible assembly 100, from where the crystal ingot 16 is being grown. The insulation 160 also has heater insulation 168 that extends inward from the side insulation 162 at least partially over the heater 150, and crucible insulation 170 that extends further inward. The crucible insulation 170 at least partially overlaps the crucible assembly 100.

In some embodiments, the insulation 160 is made of multiple pieces of insulation that are interconnected to limit flow paths and thermal view factors between the pieces of insulation.

The crystal puller 10 of this embodiment includes a heat shield 180 mounted in the growth chamber 62 adjacent crucible assembly 100. The heat shield 180 extends inward from the central opening 166 of the top insulation 164 at least partially over the melt 14. The heat shield 180 has a conical member 182 with a central opening sized and shaped to surround the ingot 16 as the ingot 16 is pulled up from the melt 14. However, any suitable horizontally rotated cross-sectional shape that separates the melt 14 from the upper area 64 of the lower housing 60 and has a central opening to allow the ingot 16 to be pulled therethrough may be used.

The heat shield 180 includes a baffle 190 extending vertically downward from the conical member 182. The baffle 190 is suitably formed as part of the conical member 182, which may be made integrally or as an assembly of multiple parts. In this embodiment, both the conical member 182 and the baffle 190 are made of graphite, graphite coated with silicon carbide, or high purity molybdenum, though other suitable materials may be used.

The lower area 66 in the lower housing 60 surrounding the crucible assembly 100 is generally referred to as the "hot zone" of the crystal puller 10. The hot zone components include the susceptor 130, heater 150, insulation 160, and heat shield 180. In some embodiments, the lower housing 60 includes a cooling jacket or water jacket (not shown).

As discussed above, feedstock material 12 is simultaneously supplied to and melted in the crucible assembly 100 while the ingot 16 is grown from the melt 14 during the continuous Czochralski method of producing single ingots.

This solid feedstock material 12 is not immediately liquefied in the melt 14 and may enter an area of the melt immediately adjacent the growing ingot 16 or become airborne and directly contact the ingot causing a defect or dislocation in the ingot. Pieces or fragments of solid feedstock located within the melt in the area immediately adjacent the growing ingot 16 are colloquially referred to as "fish." These contaminating particles can cause loss of structure of the growing ingot 16.

Some of the solid feedstock material 12 may become airborne, due to, for example dust, solid feedstock colliding with and bouncing off of other solid feedstock, or bursting of hydrogen bubbles that are formed about the solid feedstock during its melting. Pieces of the solid feedstock that become airborne are colloquially referred to as "birds." Using embodiments of this disclosure, during the ingot growing process, these fish and birds are prevented from entering the inner zone and causing a defect or dislocation in the ingot.

Located within the crystal growth chamber 62, the crucible assembly 100 includes a crucible 102 that forms a cavity 104 for containing the melt 14 therein. The crucible 102 is approximately concentric with the pull mechanism 42 and is arranged to accept feedstock material 12 from the feed tube 20.

As discussed above, adding solid feedstock material 12 to melt 14 may also cause the surface of the melt to be disturbed. These disturbances also affect the ability of the silicon atoms of the melt 14 to properly align with the silicon atoms of the seed crystal 44. To produce a high quality ingot 16, the melt 14 in an area adjacent to seed crystal 44/ingot 16 must be maintained at a substantially constant temperature and substantially free from surface disruptions, and foreign solid particles must be minimized.

To limit the surface disturbances and temperature fluctuations associated with the addition of feedstock material 12 in the area immediately adjacent to growing ingot 16, one or more silica barriers or weirs are located within the crucible 102. Typically, weir(s) are quartz pipes that are placed within a crucible. These weirs are positioned in the crucible assembly 100 between where the feedstock is supplied and where the ingot 16 is pulled, to form the crucible assembly 100. These weir(s) create multiple zones within the crucible assembly and inhibit un-liquefied or solid feedstock (i.e., fish) from passing into an area that is immediately adjacent to the growing crystal ingot 16.

In the embodiment shown in FIG. 1, an outer weir 106 and an inner weir 108 are located within the cavity 104 of the crucible 102. Weirs 106 and 108 inhibit inward propagation of melt surface disturbances by separating the melt 14 into an outer melt portion 110, an intermediate melt portion 112, and an inner melt portion 114. The outer melt portion 110 is located outward of the outer weir 106 or in an outer zone. The intermediate melt portion 112 is located between the outer weir 106 and the inner weir 108 or in an intermediate zone. The inner melt portion 114 is located inward of the inner weir 108 or in an inner zone, and is adjacent to the growing ingot 16. The weirs 106 and 108 inhibit movement of fish in the melt 14 from the outer melt portion 110 to the inner melt portion 114.

In other embodiments, movement of melt 14 between the zones may be permitted through one or more passages (not shown) in the lower sections of the weirs 106 and 108.

The movement of melt 14 is substantially limited to below the weirs 106 and 108 or through passages formed in the weirs 106, 108. As a result, any movement of melt 14 into the inner zone is at a location beneath or directly opposite to that of the top of the melt, where ingot 16 is being pulled. This confinement of the melt movement limits surface disruptions and temperature fluctuations along the top of the inner melt portion of the melt 14, which limit dislocations in the forming ingot.

Passages formed in the weirs 106 and 108 permit controlled movement of the melt 14 between the outer zone and the inner zone. Inhibiting or limiting movement of the melt 14 between the zones allows the feedstock material 12 in the outer zone to heat to a temperature that is approximately equivalent to the temperature of the inner melt portion as the feedstock material passes into the inner zone.

The crucible 102 and the weirs 106 and 108 are suitably made of quartz, and the melt 14 and feedstock material 12 are silicon. In these embodiments, the silicon melt 14 is corrosive and could cause cut-through of the quartz of the crucible 102 and the weirs 106 and 108 at low pressures to significantly limit the total run time of the system. To prevent excessive erosion of the crucible 102 and the weirs 106 and 108 which would limit the total run time, oxygen adjacent to the quartz is biased upwards by controlling a supply of inert gas 36, such as argon, from the gas system 34 at a pressure of between about 15 and about 75 Torr and a flow of between about 90 and about 140 SLPM. The higher oxygen content in the melt surface then limits the quartz erosion rate. The higher pressures reduce the velocity of the argon within the crystal puller 10, resulting in a decrease in silicon monoxide being evaporated from the melt surface. Less silicon monoxide is then carried into the exhaust lines preventing the premature blocking of the exhaust lines and early run termination.

As noted above, the birds must be prevented from entering the area immediately adjacent the growing ingot. The trajectory of every unconstrained bird cannot be determined since large silicon particles of the solid feedstock may bounce off of the melt, collide and recoil with each other, and ricochet off of the system structure. Melt flows in the inner zone can move birds that land in the inner melt surface toward the growing ingot, causing these unmelted silicon particles to contact and form a defect or dislocation in the growing ingot. Thus, there are a large number of possible trajectories for birds or other contamination. By use of overlapping weirs 106, 108 and heat shield 180, the trajectories of these birds are limited to prevent them from entering the inner melt portion 114 and contacting the growing ingot 16, especially adjacent the solid-liquid interface.

The weirs 106, 108 in combination with the heat shield 180 of this disclosure prevent line-of-sight or direct paths from outward of the outer weir 106, especially from the feedstock tube or channel, to an area inward of the inner weir 108. By interrupting the line-of-sight between the outer zone and inner zone, the risk of particle ricochet or some Newtonian trajectory which would allow birds and contamination to enter the inner zone is reduced.

As shown, the upwardly extending weirs 106 and 108 are parallel to each other and have different lengths. In some embodiments, the upwardly extending weirs 106 and 108 may be of substantially equal lengths. In other embodiments, the weirs 106 and 108 may have complex shapes.

The baffle 190 of the heat shield 180 is disposed at a position that places the baffle between the weirs 106 and 108 upon installation of the heat shield within the crystal puller 10.

The tops of the weirs 106 and 108 form a tangency cone by extending a straight line between the two tops and then rotating the line about the center of the weirs 106 and 108. In other embodiments, the weirs 106 and 108 may have the same height, forming a tangency line or plane between the tops of the weirs 106 and 108. The baffle 190 extends downward from the conical member 182 through the tangency plane or cone, piercing the trapezoidal revolution volume defined by the weirs 106 and 108, to form a tortuous arrangement or labyrinth gas path 192 to prevent birds and contamination from entering the area adjacent the growing ingot 16.

The spacing between the weirs 106 and 108, the baffle 190, and conical member 182 may be sized for sufficient argon outflow through the labyrinth areas, e.g., to prevent an inward flow of gases that could carry contamination or birds. Sufficient argon outflow keeps very small contamination (e.g. dust or very small particles) from entering the area adjacent the growing ingot 16 and causing a defect or dislocation in the ingot.

The baffle 190 may be spaced from the top surface of the weirs 106 and 108 a minimum distance that is determined by melt splashing condition between the weirs 106 and 108. This melt splashing condition typically depends upon purge gas flow, pressure, and temperature, among other factors.

The length of the baffle 190, or the distance that the baffle extends between the weirs 106 and 108, and beyond the tangency cone, may also depend upon other design considerations.

In other embodiments, the number of weirs and baffles may be varied. In these embodiments, at least one of the weirs or baffles extends into a tangency cone or plane created by a plurality of the other to prevent line-of-sight or direct paths from outward of the outer weir 106 to an area inward of the inner weir 108.

Figure 3:
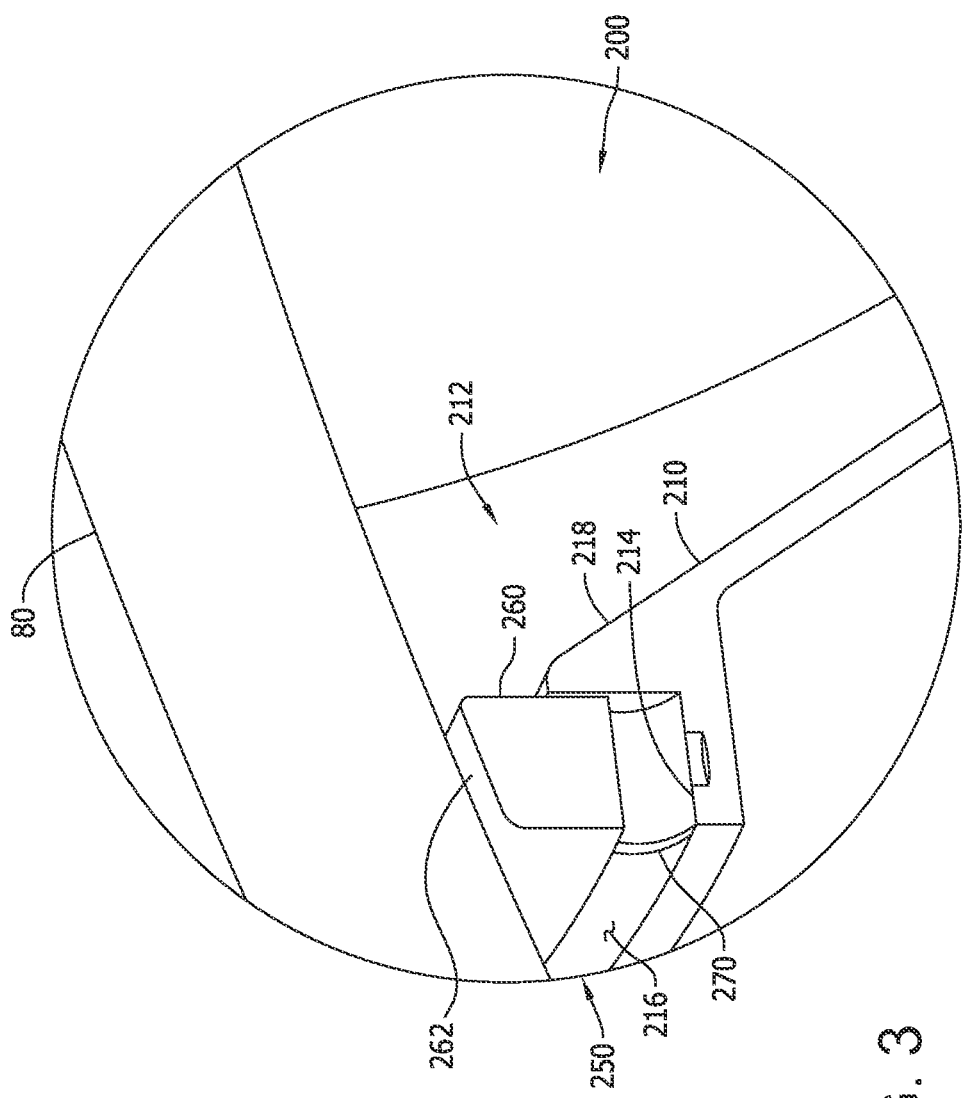
FIG. 3 is an enlarged section of the dust barrier and lower housing of FIG. 1 showing a seal assembly.

The crystal puller 10 also includes a dust barrier 200 (broadly, a device) for inhibiting particles from entering the melt from the upper area 64 during the crystal ingot growing process. This device 200 isolates the feed region from the crystal growth region during the crystal ingot growing process. As shown in FIG. 3, the dust barrier 200 includes a dust shield 210 and a seal 250.

Figure 2:
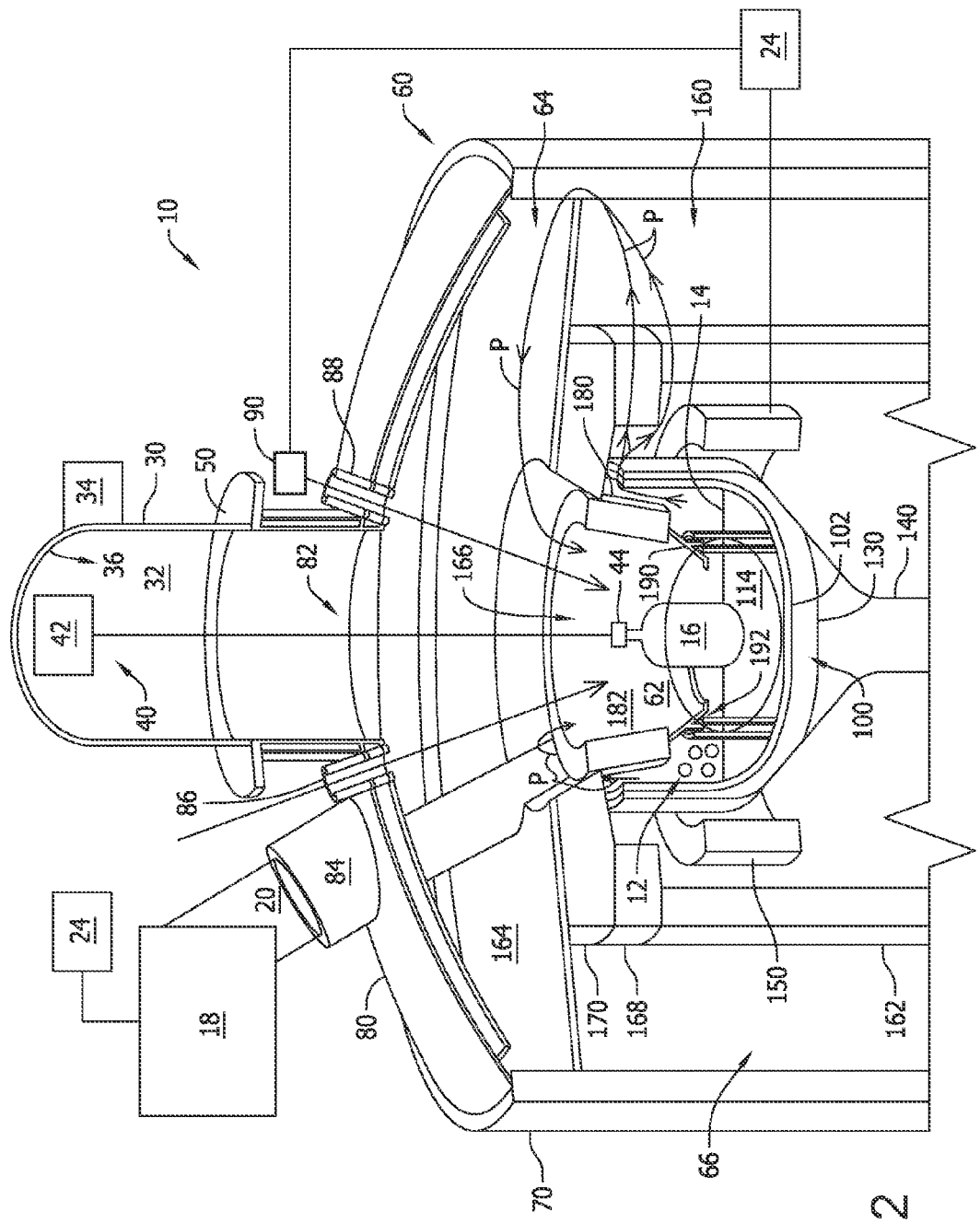
FIG. 2 is a schematic sectional view of a crystal puller without a dust barrier illustrating dust particle paths from a feed region to a crystal growth region.

FIG. 2 is a sectional view of a crystal puller 10 without the device 200 or dust shield 210. As shown in FIG. 2, airborne particles, such as dust from feedstock material 12, can travel or pass through, or up and around the insulation 160 along particle pathways P and land in the inner melt portion 114, resulting in the loss of zero dislocation growth. As described in more detail herein, the device 200 facilitates sealing the upper area 64 from the feed region and preventing particles, such as dust from feedstock material 12, from entering the growth region or the inner melt portion 114.

Figure 4:
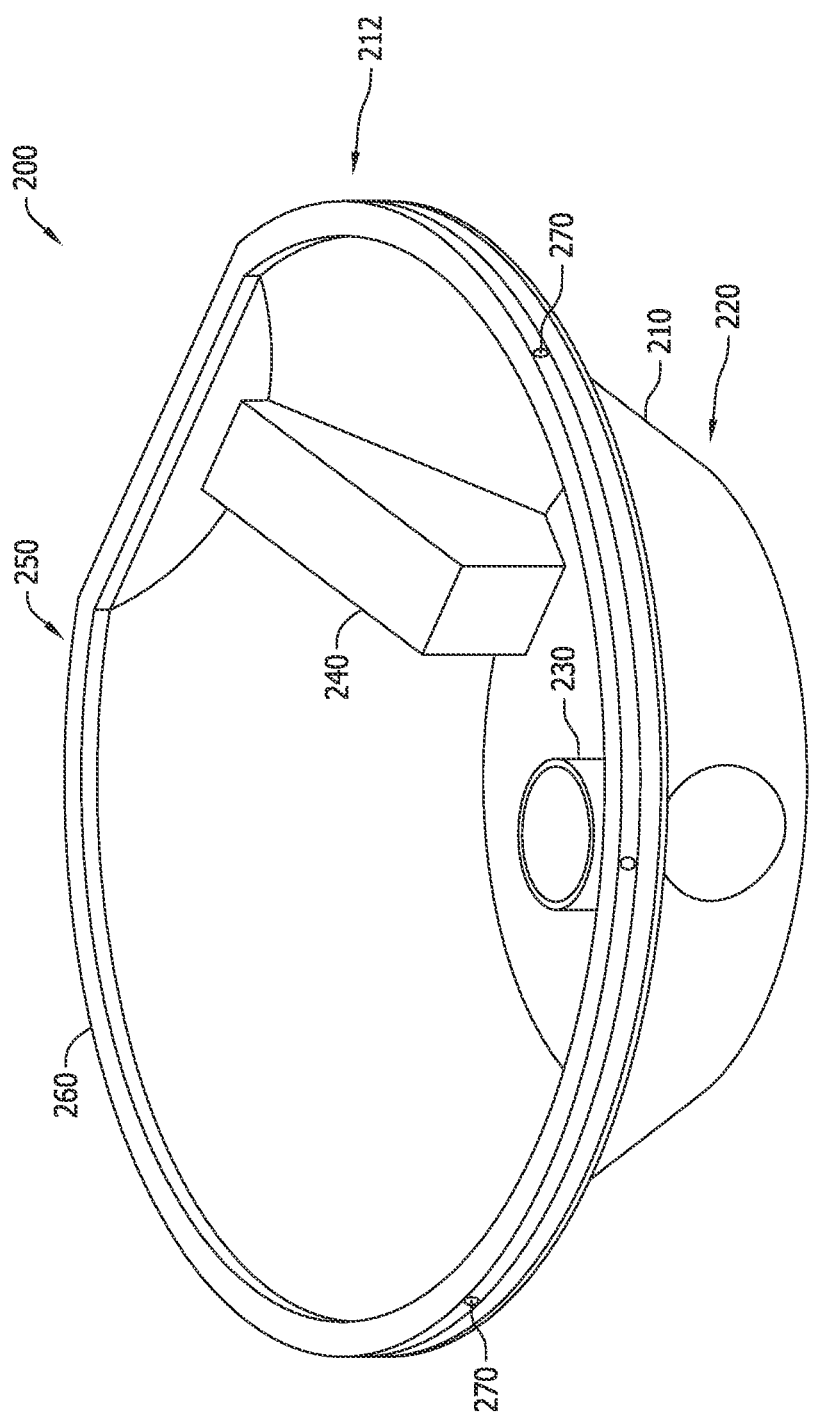
FIG. 4 is a top perspective view of the dust barrier.
Figure 5:
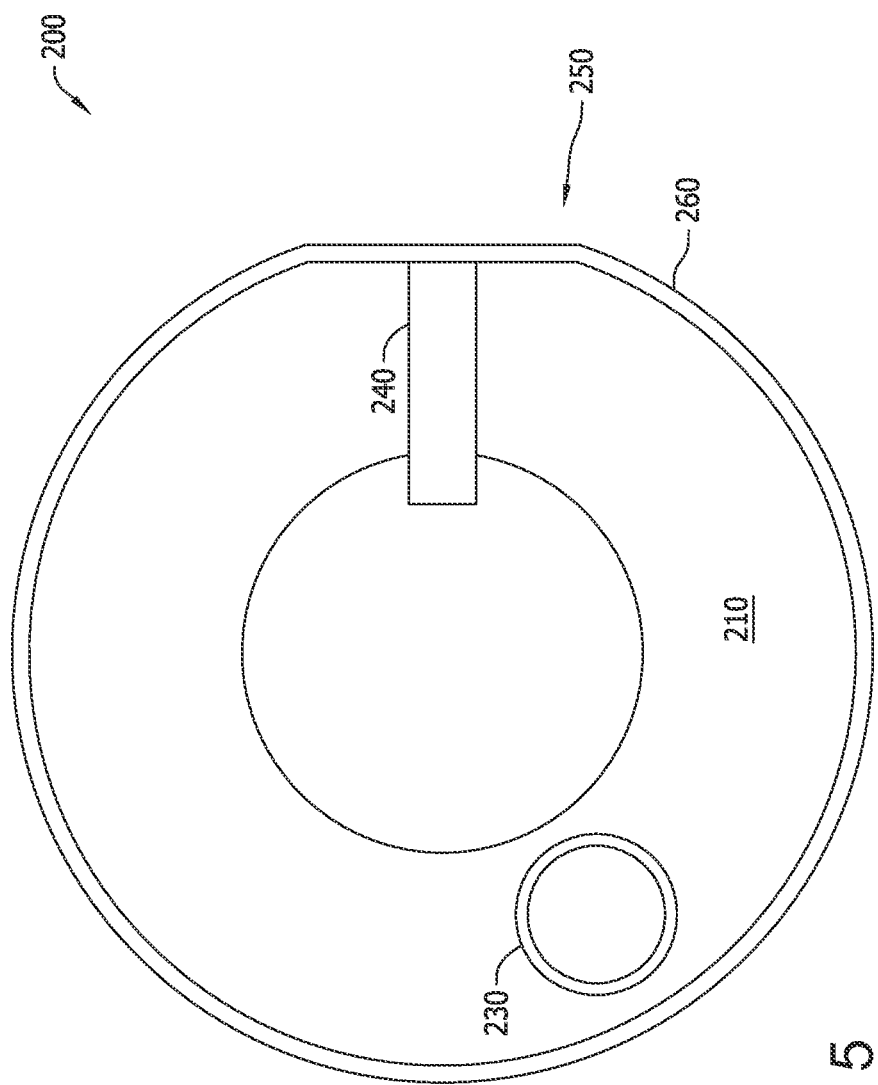
FIG. 5 is a top view of the dust barrier.
Figure 6:
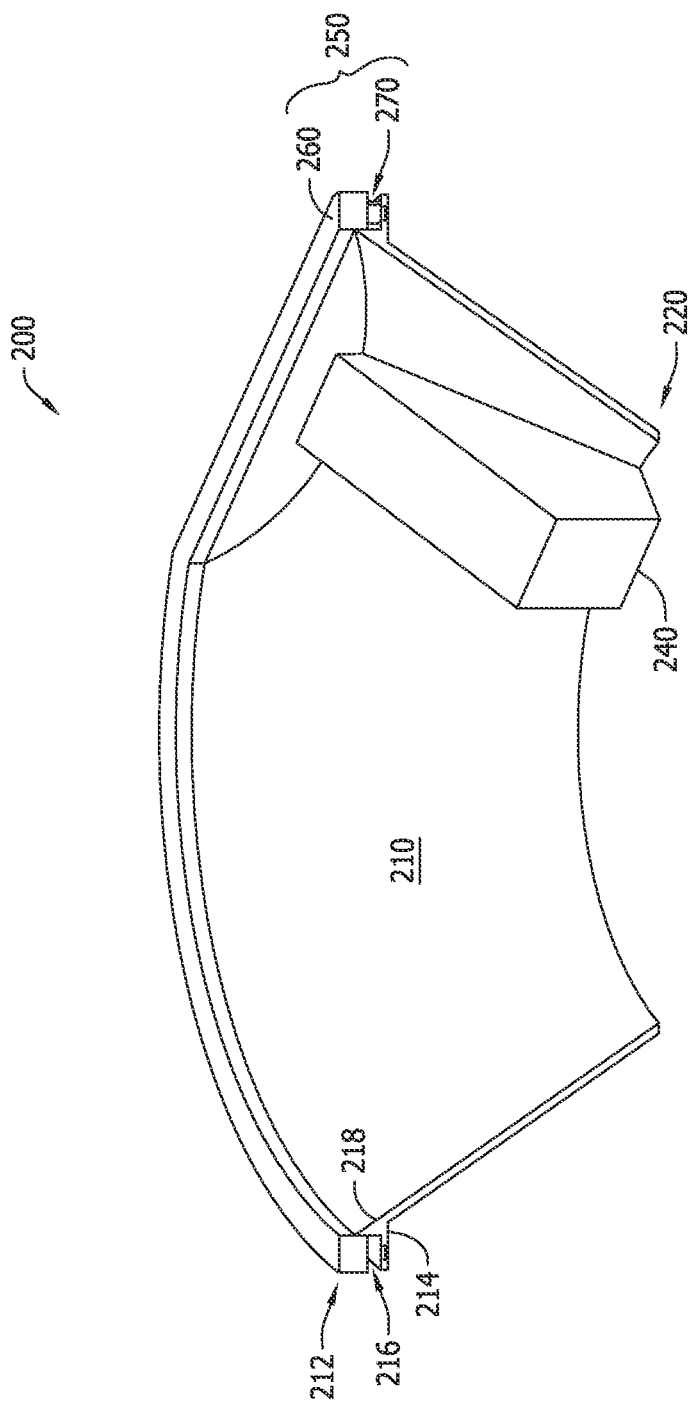
FIG. 6 is a section of the dust barrier.

With additional reference to FIGS. 4-6, the dust shield 210 is formed in a truncated cone shape that is connected with either the insulation 160 or heat shield 180 and extends up to the upper wall 80 and around the aperture 82. As such, the dust shield 210 inhibits particles from entering the growth chamber 62 through the upper area 64 of the lower housing 60, as illustrated by particle pathways P in FIG. 2.

With reference to FIGS. 1, 3, and 4, the dust shield 210 is inserted into the crystal puller 10 between the upper wall 80 and the insulation 160 during installation. The dust shield 210 has a top portion 212 with a diameter greater than a diameter of the aperture 82 to allow unobstructed access to the growth chamber 62 through the upper wall 80. The top portion 212 of the dust shield 210 is connected with the upper wall 80 via seal 250 radially outward of the aperture 82, and extends circumferentially around the aperture 82 to seal off a radially inner portion of the upper area 64. The dust shield 210 is connected with the upper wall 80 via seal 250 radially outward of the view port 86 to prevent visual obstruction of the growth chamber through the view port. The top portion 212 of the dust shield 210 is not directly attached to the upper wall 80, but is biased towards the upper wall 80 to prevent particles from passing therebetween. The dust shield 210 has a bottom portion 220 that is connected or attached to either the insulation 160 or heat shield 180.

In some embodiments, the dust shield 210 is graphite. In some embodiments, the heat shield 180 and the dust shield 210 are formed as a single unit. In other embodiments, the dust shield 210 may be any shape that mates with both the upper wall 80 and either the insulation 160 or heat shield 180 that inhibits passage of particles into the inner melt portion 114, without obstructing views or instrumentation.

With additional reference to FIGS. 5 and 6, the dust shield 210 has a duct 230 that encircles the feed tube 20, which extends through the upper wall 80 and into the growth chamber 62. The duct 230 is a tube that extends upward from the conical portion of the dust shield 210 to prevent particles from passing into the inner melt portion 114 from between the feed tube 20 and the insulation 160.

The dust shield 210 also has a cowl 240. The cowl 240 is a "bump" or protrusion in the dust shield 210 that extends from a side of the dust shield 210 to the center of the dust shield 210. This protrusion provides a path for a tube, such as a dopant feed tube (not shown), to supply another material, such as dopant, to the outer melt portion 110. The cowl 240 allows access to both the outer melt portion 110 from a side of the dust shield 210 and the inner melt portion 114 through the upper wall 80. The cowl 240 also allows access to the outer melt portion 110 without the need for a separate seal for the tube through the side of the dust shield 210.

The seal 250 defines a top portion of the dust barrier 200, and encircles at least a portion of the top portion 212 of the dust shield 210. The dust shield 210 includes a ledge 214 to provide a support surface for the seal 250 to rest against. The dust shield 210 also includes a wall 218 adjacent the seal 250 that partially overlaps the seal 250 to maintain placement of the seal 250 during installation of the device 200 in the crystal puller 10. The seal 250 extends above the wall 218 to provide space between the dust shield 210 and the upper wall 80.

The seal 250 connects dust shield 210 with the upper wall 80. Upon installation of the dust shield 210 in the crystal puller 10, the seal 250 is longitudinally compressed or biased against the upper wall 80 to form a seal between the device 200 and the upper wall 80. The seal 250 has a sealing ring 260 and a spring 270 that compresses or biases the sealing ring 260 against the upper wall 80. As shown, the sealing ring 260 has a constant trapezoidal cross-section and includes an angled top surface 262 that generally conforms to the shape of the upper wall 80. In some embodiments, the sealing ring 260 may have other cross-sectional shapes.

In other embodiments, the sealing ring 260 may have a complex shape to provide better sealing with the upper wall 80. In these embodiments, the sealing ring 260 may have an uneven top surface that has hills and valleys to accommodate uneven surfaces in the hand formed domes 80. The hand forming process of the upper wall 80 creates uneven surfaces, and the sealing ring 260 mates against these surfaces. Thus, the sealing ring 260 may suitably be formed to match the contour of the upper wall 80. In other embodiments, the sealing ring 260 is thin enough to allow it to be fitted to the upper wall 80.

The spring 270 is seated in a pocket 216 defined by the ledge 214 and the wall 218 to maintain its placement during installation and use of the device 200. The ledge 214 and wall 218 may define any number of pockets 216 to house a plurality of springs 270. In some embodiments, not all of the pockets 216 house a spring 270. In some embodiments, the springs 270 may be equally spaced about the ledge 214.

In the example embodiment, the spring 270 is a coiled spring that exerts a displacement force against the sealing ring 260 to bias the sealing ring away from the ledge 214 of the dust shield 210 and against the upper wall 80. In the example embodiment, the spring 270 is formed from two coiled sheets of metal, such as molybdenum, steel, or alloys thereof. One suitable method of making the spring 270 includes laying two sheets of metal out flat on top of one another and then rolling them into a coil. The ends of the spring are then pinned together to create a stiff spring. The spring 270 is capable of maintaining its stiffness during repeated thermal cycles, or crystal growing processes before needing to be replaced.

In some embodiments, the sealing force from the spring 270 may be increased or decreased by adjusting the diameter, thickness, or material of the spring. The diameter may be adjusted by deforming the spring 270 to match a new mandrel. In other embodiments, the sealing force may be varied by increasing or decreasing the number of springs 270 used to bias the sealing ring 260 upwards and away from the dust shield 210.

In this embodiment, the sealing ring 260 is made of graphite. In other embodiments, the sealing ring 260 includes a graphitized felt placed along the top surface 262 of the sealing ring 260, adjacent the upper wall 80. In this embodiment, the crystal puller is allowed to initially operate without feedstock material 12 to remove any felt particles that are broken off during the installation process. In other embodiments, the sealing ring 260 may be a non-contaminating material that has a high working temperature and has the ability to conform to the upper wall 80 either before or during the crystal ingot 16 pulling process. Suitable conformable, non-contaminating, high-temperature materials from which the sealing ring 260 may be formed include, for example and without limitation, oxide felts, such as alumina. As with graphite felts, a pressure differential across the sealing ring 260 may be established to generate a radially outward flow through the felt to drive particles generated by the felt away from the growing crystal.

The spring 270 is suitably made of an elastic material, such as molybdenum or steel. These suitable materials allow the spring to be deformed up to the yield point of the material and then return to the original shape of the spring. Suitable materials are capable of retaining stiffness at the operational temperatures of the crystal puller 10. However, the operational temperatures of the crystal puller 10 may lower the number of cycles a spring 270 may be used before the spring must be replaced. In some embodiments, the spring 270 is a helically coiled spring. In some embodiments, the spring 270 is a leaf spring. In other embodiments, the spring 270 may have any suitable shape that biases the sealing ring 260 away from the ledge 214 and/or against the upper wall 80.

In some embodiments, the upper wall 80 includes a lip 92 (FIG. 1) that is sized to at least partially overlap the sealing ring 260 of the seal 250. The lip 92 may also partially overlap the wall 218 of the dust shield 210. In some embodiments, the lip 92 is aligned with the sealing ring 260 to provide a flat or planar face. In these embodiments, the sealing ring 260 is also flat to mate against the planar face and to provide a seal therebetween. In other embodiments, the upper wall 80 is worked to provide a flat or planar face that is within predetermined tolerances.

The above embodiments advantageously provide better system performance by restricting contaminants from reaching the inner melt portion or contacting the growing ingot.

Figure 7:
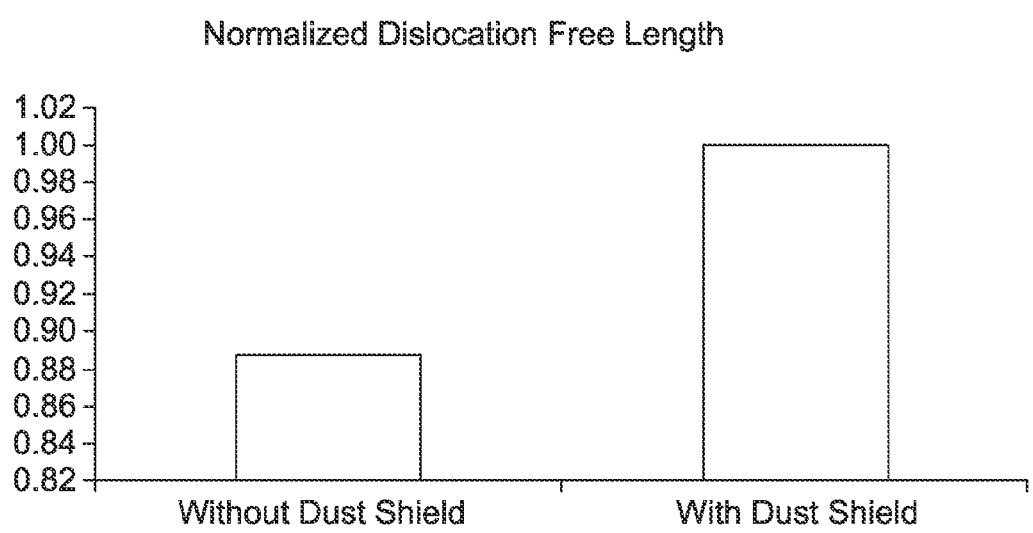
FIG. 7 is a graph comparing the normalized dislocation free length of the crystals grown with and without a dust barrier.

With reference to FIG. 7, an experiment was conducted to compare the normalized dislocation free length of crystals grown with and without a dust barrier. This experiment included 98 crystals grown with a dust barrier, as disclosed herein, and 98 crystals grown without a dust barrier. As shown, the entire average normalized length of crystals grown with the dust barrier was substantially dislocation free. However, approximately 89% of the average normalized length of crystals grown without the dust barrier was dislocation free. As such, the use of the dust barrier disclosed herein produced approximately 10% more dislocation free length as compared to crystals grown without the dust barrier. Accordingly, use of the dust barrier was shown to increase the overall yield per run approximately 10%, while lowering overall operating cost because of less waste.

Embodiments of the system inhibit dust particles from the solid feedstock material in the feed zone from reaching the growing ingot through the upper area of the lower housing. Reducing disturbances in the surface of the melt increases the yield of high zero dislocation (ZD) ingots.

Additionally, use of embodiments consistent with this disclosure may reduce the risk of contaminating the melt, and the risk of loss of structure in the ingot caused by particles entering the inner melt portion by the use of a dust barrier to inhibit access to the melt through the upper area. The reduction in risk and improved efficiency and runtime not only increase the overall production of the crystal forming system, but also lowers overall operational costs.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A crystal puller for growing a crystal ingot from a melt, the crystal puller comprising:
   a housing enclosing a growth chamber, the housing having an upper wall with an inner surface and an aperture for removal of the crystal ingot from the growth chamber;
   insulation separating an inside of the housing into an upper area and a lower area, the insulation having a central opening;
   a crucible assembly within the lower area to contain the melt therein;
   a heat shield adjacent the central opening of the insulation, the heat shield forming a labyrinth gas path with the crucible assembly; and
   a dust barrier distinct from the heat shield and extending from the inner surface of the upper wall to one of the insulation and the heat shield, the dust barrier sealingly connected to the inner surface of the upper wall around the aperture to inhibit particles from entering the growth chamber through the upper area of the housing;
   wherein the dust barrier includes a dust shield and a seal, the dust shield connected with the upper wall by the seal to inhibit passage of particles between the dust shield and the upper wall, and the seal includes a sealing ring and a spring to exert a displacement force on the sealing ring to bias the sealing ring away from the dust shield.

2. The crystal puller of claim 1, wherein the dust barrier is sealingly connected to the upper wall radially outward of the aperture to allow unobstructed access to the growth chamber through the upper wall.

3. The crystal puller of claim 1, wherein the dust barrier has a top portion in compression against the upper wall.

4. The crystal puller of claim 1, wherein the dust barrier has a bottom portion connected with one of the insulation and the heat shield.

5. The crystal puller of claim 1, wherein the dust shield includes a wall overlapping the sealing ring.

6. The crystal puller of claim 1, wherein the upper wall includes a lip sized to overlap the sealing ring.

7. The crystal puller of claim 1, wherein the heat shield and the dust barrier are formed as a single unit.

8. The crystal puller of claim 1, wherein the upper wall includes a port to allow access to the growth chamber during the crystal ingot growing process, the dust barrier connecting with the upper wall radially outward of the port to allow unobstructed access to the growth chamber through the port.

9. The crystal puller of claim 1, wherein the crystal puller includes a tube extending from the upper wall into the growth chamber, the dust barrier having a duct encircling the tube.

10. The crystal puller of claim 1, wherein the heat shield includes a conical member including a central opening sized and shaped to surround the crystal ingot.

11. The crystal puller of claim 10, wherein the heat shield further includes a baffle extending vertically downward from the conical member.

12. The crystal puller of claim 11, wherein the crucible assembly includes at least two weirs extending vertically upward from the crucible assembly.

13. The crystal puller of claim 12, wherein the baffle extends vertically downward between the at least two weirs to define the labyrinth gas path.

14. The crystal puller of claim 13, wherein the dust barrier has a truncated cone shape.

15. The crystal puller of claim 14, wherein the dust barrier sealingly connected to the inner surface of the upper wall is disposed radially outward of the temperature port.

16. The crystal puller of claim 13, wherein the upper wall includes a feed port, a view port, and a temperature port, the dust barrier sealingly connected to the inner surface of the upper wall radially outward of the view port.

17. The crystal puller of claim 16, wherein the dust barrier sealingly connected to the inner surface of the upper wall radially outward of the feed port, wherein the dust barrier includes a duct extending upward from a conical portion of the dust barrier, the duct configured to encircle a feed tube extending from the feed port.

18. A crystal puller for growing a crystal ingot from a melt, the crystal puller comprising:
   a housing enclosing a growth chamber, the housing having an upper wall with an inner surface and an aperture for removal of the crystal ingot from the growth chamber;
   insulation separating an inside of the housing into an upper area and a lower area, the insulation having a central opening;
   a crucible assembly within the lower area to contain the melt therein;
   a heat shield adjacent the central opening of the insulation, the heat shield forming a labyrinth gas path with the crucible assembly; and
   a dust barrier separate and distinct from the heat shield and extending from the inner surface of the upper wall to one of the insulation and the heat shield, the dust barrier being sealingly connected to the inner surface of the upper wall around the aperture to inhibit particles from entering the growth chamber through the upper area of the housing, the dust barrier having a top portion with a diameter greater than a diameter of the aperture to allow unobstructed access to the growth chamber through the upper wall;
   wherein the dust barrier includes a dust shield and a seal, the dust shield connected with the upper wall by the seal to inhibit passage of particles between the dust shield and the upper wall, and the seal includes a sealing ring and a spring to exert a displacement force on the sealing ring to bias the sealing ring away from the dust shield.

* * * * *